(12) United States Patent
Nakayama

(10) Patent No.: US 6,259,715 B1
(45) Date of Patent: *Jul. 10, 2001

(54) SURFACE EMITTING SEMICONDUCTOR LASER ARRAY HAVING A MATRIX DRIVING TYPE ARRANGEMENT

(75) Inventor: Hideo Nakayama, Nakai-machi (JP)

(73) Assignee: Fuji Xerox Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/137,296

(22) Filed: Aug. 20, 1998

(30) Foreign Application Priority Data

Aug. 21, 1997 (JP) ................................... 9-225383

(51) Int. Cl.[7] ............................ H01S 5/00; H01S 3/08
(52) U.S. Cl. ................................. 372/50; 372/96
(58) Field of Search ................. 372/50, 96, 43

(56) References Cited

U.S. PATENT DOCUMENTS 5,031,187    7/1991  Orenstein et al. .............. 372/50
5,073,041 *  12/1991 Rastani .......................... 372/43

OTHER PUBLICATIONS

IEEE Photonics Technology Letters, vol. 6, No. 8, Aug. 1994, "Two–Dimensional Matrix Addressed Vertical Cavity Top–Surface Emitting Laser Array Display", R.A. Morgan et al., pp. 913–917.

Electronics Letters, vol. 27, No. 5, Feb. 1991, "Matrix Addressable Vertical Cavity Surface Emitting Laser Array", M. Orenstein et al., pp. 437–438.

* cited by examiner

Primary Examiner—Quyen P. Leung
(74) Attorney, Agent, or Firm—Oliff & Berridge, PLC

(57) ABSTRACT

A surface emitting semiconductor array is provided with a plurality of surface emitting semiconductor laser units, each surface emitting semiconductor laser unit has a surface emitting semiconductor laser body comprising top and bottom spacer layers sandwiching an active layers and top and bottom reflection films sandwiching the above-mentioned spacer layers with each surface emitting semiconductor laser body formed on a conductive bottom contact layer having a flat area larger than the flat area of the body, which units are insulated by insulating films from each other and arranged in the matrix form on an insulating substrate. A plurality of top side electrodes having metal which are successive in one direction of the matrix are formed on the above-mentioned plurality of units arranged in parallel in one direction of the matrix, and a plurality of bottom electrodes having metal continuous in the other direction of the matrix are formed on the top surface of the bottom contact layer of the units arranged in parallel in the other direction of the matrix.

5 Claims, 15 Drawing Sheets

SURFACE EMITTING SEMICONDUCTOR LASER ARRAY HAVING A MATRIX DRIVING TYPE ARRANGEMENT

BACKGROUND OF THE INVENTION

1. Field of the Invention

The present invention relates to an improved surface emitting semiconductor laser array, and more particularly relates to a matrix driving type surface emitting semiconductor laser array improved in power consumption by reducing the resistance of the current passage.

2. Description of Related Art

For using in the fields of optical exchange and optical information processing, surface emitting laser arrays having a two-dimensional matrix array of surface emitting lasers (VCSEL namely Vertical Cavity Surface Emitting Laser) are required, particularly large scale surface emitting semiconductor laser arrays having a large number of surface emitting semiconductor lasers are required.

To use a large scale surface emitting semiconductor array, it is required to drive respective component surface emitting lasers independently, the respective elements should be connected independently in the connection arrangement, therefore, in the case of an independent driving type surface emitting semiconductor laser array of M rows and N columns, M×N connection wiring is required.

A matrix type driving system has been developed in which a plurality of row direction lines for connecting the respective surface emitting lasers in the row direction in parallel are provided on the front surface of the surface emitting semiconductor laser array, and on the other hand a plurality of column direction lines for connecting the respective surface emitting lasers in the column direction are provided on the back surface of the surface emitting semiconductor laser array, then one of the row direction lines and one of the column direction lines are selected to select and light the surface emitting laser located at the intersection position.

In this matrix driving system, a surface emitting semiconductor laser array of M rows and N columns may have M+N electrodes.

One column of the matrix driving type surface emitting semiconductor laser array is described with reference to FIGS. 15 to 17.

FIG. 15 is a perspective view, FIG. 16 is a plain view, and FIG. 17 is a side view viewing from the right in FIG. 15 of a matrix driving type surface emitting semiconductor laser array.

In manufacturing the surface emitting semiconductor laser array, by use of molecular beam epitaxy, a bottom contact layer 52 comprising an n-type GaAs layer is formed on a semi-insulating GaAs substrate 51, and an n-side multilayer reflection film 53 with the total thickness of several μm having alternately laminated AlAs layers and GaAs layers being ¼ of in-medium wavelength in respective film thickness is formed on the bottom contact layer 52. Next, an undoped active layer 54 having the same film thickness as an in-medium wavelength and having a laminate structure comprising two $Al_{0.4}Ga_{0.6}As$ layers with interposition of a laminate quantum well layer comprising three layers of two GaAs layers with a thickness of 10 nm and one $In_{0.2}Ga_{0.8}As$ layer inserted between the GaAs layers is formed, and on the undoped active layer 54, a p-side multilayer reflection film 55 with the total thickness of several μm having alternately laminated AlAs layers and GaAs layers being ¼ of in-medium wavelength in respective film thickness is formed on the undoped active layer 54. In these processes, Si is used as an n-type dopant and Be is used as a p-type dopant respectively. Next, by applying reactive ion etching, grooves 56 for wiring separation are formed to provide M rows in vertical direction (top-bottom direction in FIG. 16). The depth of the grooves 56 extends through the bottom contact layer 52 to the semi-insulating GaAs substrate 51 for electrical separation of rows. The grooves 56 are filled with polyimide. Next, by applying vacuum evaporation, an Au layer is formed on the p-side multilayer reflection film 55, and the Au layer is removed from the boundary areas of the respective columns to form N p-side electrode wiring 57 extending in the column direction (right-left direction in FIG. 16). Proton is injected on areas between p-side electrode wires 57, which define the column direction lines, so as to penetrate from the p-side multilayer reflection film 55 at least to the active area 54, and the groove area is insulated to separate the rows. Only on the ends (near side end in the drawing), etching is continued until the bottom contact layer 52 comprising an $n^+$ GaAs layer is exposed. On the exposed surface, electrode pads (n-side electrode pads) 58 for respective rows are formed. On the ends of p-side electrodes 57 which define respective column direction lines, electrode pads (p-side electrode pads) 59 for respective columns are formed.

To select an arbitrary point (i, j), row i and column j may be selected. In a surface emitting semiconductor laser array having the above-mentioned structure, because the p-side electrode wires are of gold, the resistance of the p-side electrode wires 57 is as low as several Ω and does not cause any problem, however, because the bottom contact layer 52 is served as the contact line to the n-side electrodes, the line resistance of a surface emitting semiconductor laser located far from an n-type electrode pad 58 is significantly large. Therefore, the power consumption of the matrix driving type surface emitting semiconductor laser array having the above-mentioned structure is significantly large.

The above-mentioned matter is described further in detail with reference to FIG. 15 again and FIG. 18.

In the surface emitting semiconductor laser array shown in FIG. 15, the bottom contact layer 52 consisting of $n^+$ GaAs layer is used as the bottom side wiring, the contact resistance between an electrode and semiconductor is at largest several Ω or lower. Herein the contact resistance is confirmed analytically using Transmission Line Model method. In the example shown in FIG. 15, the contact between an electrode and a semiconductor is an electrode pad 58. FIG. 18 shows a cross sectional view of FIG. 15, and the effective contact distance between the electrode pad 58 and the bottom contact layer 52 comprising an $n^+$ GaAs layer is operated arithmetically. The contact resistance is determined from the product of contact specific resistance and contact area where a current flows through. In this case the electrode material is metal, and the resistance and contact specific resistance are small. However, because the resistance of the $n^+$ GaAs layer is comparatively large, the electrical effective contact area with the bottom contact layer comprising an $n^+$ GaAs layer extends to the position shown with Lt in FIG. 18. Assuming that the contact specific resistance ρc is $10^{-6}$ $cm^2$, the specific resistance rs of the $n^+$ GaAs layer is $3\times10^{-4}$ cm Ω (determined under the assumption that the carrier concentration n is $10^{19}$ $cm^{-3}$ and carrier mobility μ is 5000 $cm^2$/V sec using 1/e nμ. Wherein e is an elementary charge of $6\times10^{-19}$ coulomb), and the length of an electrode pad d (horizontal direction of the paper plane in FIG. 18) is 1 mm, Lt is calculated from the equation $\rho c=(Lt \times \surd(\rho crs)) \div \coth (d/Lt)$ and then 10 $\mu$m is obtained as the result. Therefore, in the case of the electrode pad with a width of 10 $\mu$m, the effective contact area is 10 $\mu$m×10 $\mu$m. The contact specific resistance of $10^{-6}$ $cm^2$ gives the contact resistance between an electrode and semiconductor of 1 $\Omega$, this value is sufficiently smaller than the resistance of the surface emitting laser body.

However, in the surface emitting semiconductor laser array shown in FIG. 15, because the $n^+$ GaAs layer is used for the bottom side wiring, the wiring resistance calculated based on the specific resistance of $n^+$ GaAs×wiring length× cross section of the wiring (assuming wiring length of 1 mm, width of 20 $\mu$m, and thickness of 4 $\mu$m) gives 50 $\Omega$, and this value is not negligible.

As described hereinabove, in the case that the semiconductor layer is inserted in the laser structure and a current is supplied to each laser element from the end electrode pads through the contact layer, there is no problem around the electrode pads because of the small wiring resistance, but the resistance increases with distance from a pad because of high specific resistance of the semiconductor. In the case that a number of arrays are formed and the array is matrix-driven, the array is disadvantageous in that the light intensity and response speed for starting of emission depend on the location of the laser element from the vicinity of an electrode pad to the area located far from an electrode pad.

R. A. Morgan et al. discloses a structure in which the metal electrode is provided on the laser element side to reduce the wiring resistance ("Two-dimensional Laser Array display", IEEE Photonics Tech. Let., Vol. 6, No. 8 (1994) 913–917), however, it is difficult to reduce the contact resistance between a DBR layer and metal electrode because a metal electrode is formed on a conductive DBR layer (usually formed of AlGaAs material for a VCSEL which uses a GaAs substrate). The reason is that (in the example shown in FIG. 15, the shorter the wavelength is) for sufficient beam reflection on the DBR layer when a laser is oscillated and for preventing the beam from being absorbed, the more it is required that the energy gap of the DBR layer is made large by increasing the AlAs mixed crystal ratio while the increased AlAs causes the increased contact specific resistance. For example, when an $Al_{0.3}Ga_{0.7}As$ layer, which has a relatively small contact specific resistance (contact specific resistance $9 \times 10^{-4}$ $cm^2$), is used, the contact resistance between a metal electrode and this DBR layer is approximately 100 $\Omega$. As the result, if the wiring resistance in the metal electrode is reduced, the contact resistance increases, and the increased power consumption and poor response speed cannot be improved. On the other hand, there is another advantage that, if the AlAs mixed crystal ratio is reduced to reduce the contact resistance, the beam is absorbed in the DBR layer to fail to generate a laser beam.

In the case of a semiconductor laser array having a structure with a large difference between the peak and bottom, because the top matrix wiring electrode is inevitably formed on the area having the large surface gap, the gap between laser elements is apt to cause disconnection. Therefore, it is required that the bottom electrode is formed at the level as high as possible so that a structure with a reduced gap difference is formed. However, in the case of the conventional structure, because the top electrode and the bottom electrode intersect each other with interposition of a relatively thin insulating film, the intersection functions as a relatively large electric capacitor. As the result, the larger the number of elements of the array is, the poorer the response speed becomes due to the electric capacity, which is a problem. On the other hand, in the case of a laser array as shown in FIG. 15, there is no such problem because of no intersection of electrodes on the area other than that of laser elements.

As described in detail hereinabove, the matrix driving type surface emitting laser array is inevitably disadvantageous in that the resistance of the portion other than the surface emitting laser elements is large, and therefore the power consumption is large. It additionally causes a problem of reduction in driving speed.

Accordingly, it is the object of the present invention to provide a matrix driving type surface emitting laser array having the reduced resistance of the portion other than element bodies of the surface emitting laser which is a component of the surface emitting laser array and excellent in the response speed.

SUMMARY OF THE INVENTION

To solve the above-mentioned problem, A surface semiconductor laser is comprising a surface emitting semiconductor laser body: including an active layer; top and bottom spacer layers sandwiching said active layer; and top and bottom multilayer reflection films sandwiching said top and bottom spacer layers, a conductive bottom contact layer having a flat area larger than the flat area of said body formed on said bottom contact layer, an insulating substrate on which a plurality of units including said body and said bottom contact layer are arranged in the form of matrix, bottom metal electrodes formed continuously in one direction of said matrix on the side surface of said body of the top surface of the bottom contact layer of said plurality of units arranged in parallel in one direction of said matrix, top metal electrodes formed successively in the other direction of said matrix on said plurality of units arranged in parallel in the other direction of said matrix.

In detail, by applying a method in which the conductive bottom contact layer is located between the surface emitting semiconductor laser body which contains the multiple reflection (DBR) layer and the insulating substrate, a current is not injected directly into the DBR layer but injected from the bottom contact layer, it becomes possible that low contact specific resistance of the bottom contact layer is selected and the desired film thickness is prescribed without deterioration in function of the DBR layer. Because the flat area of the bottom contact layer is larger than the flat area of the laser body and the metal wiring is provided on the laser body side of the bottom contact layer, the wiring resistance is reduced and the contact resistance with the bottom contact layer is also reduced.

Because the structure that the bottom wiring is located at the undermost position of the laser structure, and the space above the bottom wiring is filled with insulating material to flatten the top surface of the structure, the top wiring is prevented from being disconnected to bring about high reliability. Additionally, because the distance between the top electrode and the bottom electrode is sufficiently large in this structure, the electric capacity formed at the intersection of the top electrode and the bottom electrode on the area other than that of laser elements is reduced to improve the response speed of the laser element.

DETAILED DESCRIPTION OF THE PREFERRED EMBODIMENTS

The surface emitting semiconductor laser array in accordance with an embodiment of the present invention will be described further hereinafter in detail.

Figure 4:
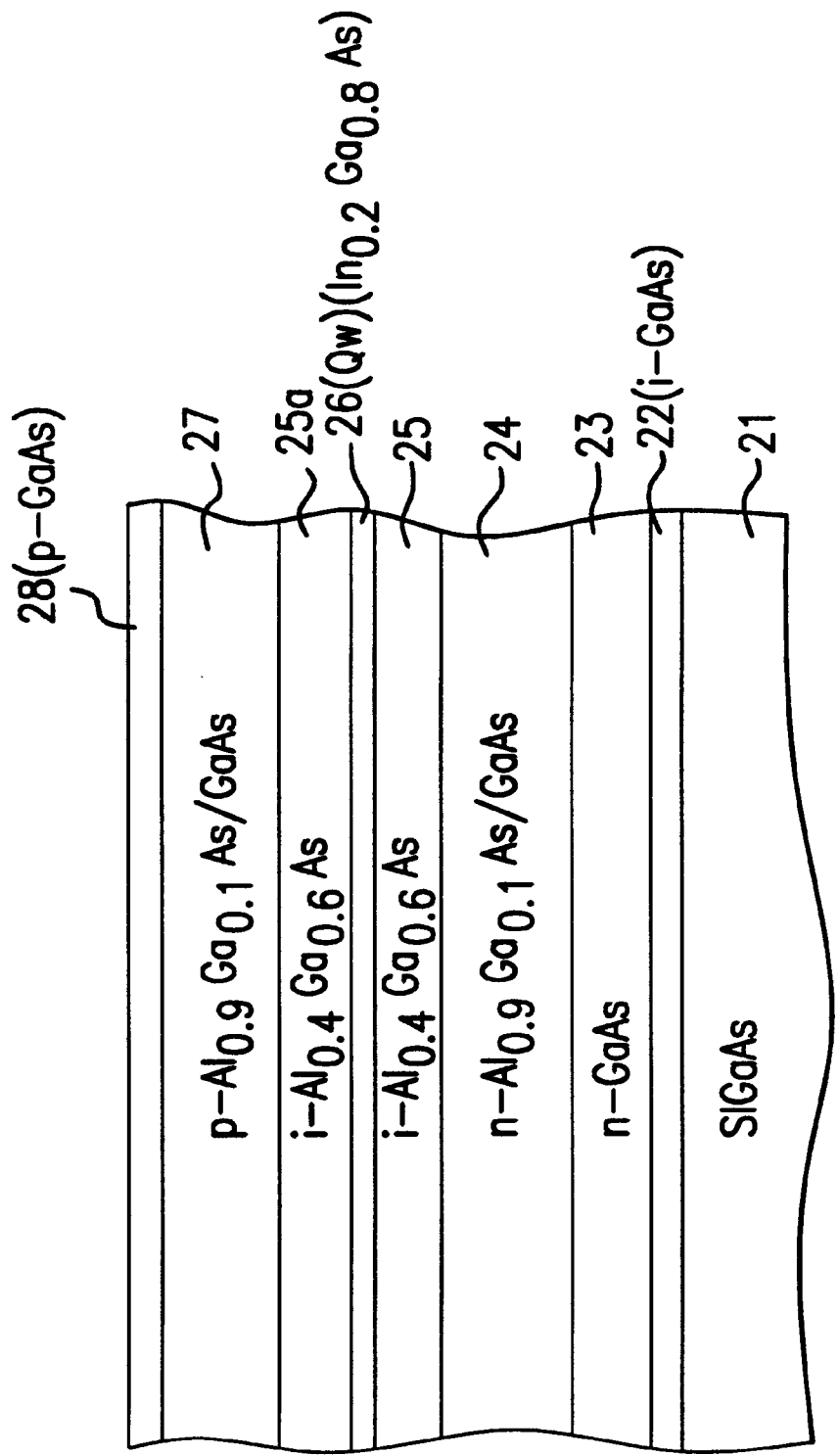
FIG. 4 is a side view of the surface emitting semiconductor laser array in accordance with the embodiment of the present invention in the manufacturing process.

The embodiment is described with reference to FIG. 4. Using the Metalorganic Chemical Vaper Deposition (MOCVD), a buffer layer 22 having a thickness of approximately 0.2 $\mu$m and comprising an undoped GaAs layer and a contact layer 23 having a carrier concentration of $1\times10^{19}$ cm$^{-3}$ and comprising an n-type GaAs layer having a thickness of 3 $\mu$m are formed one on the other on the surface of a semi-insulating GaAs substrate 21, further on these layers, an n-type multilayer reflection film 24 which is formed by laminating $Al_{0.9}Ga_{0.1}As$ layers and GaAs layers having a thickness of ¼ in-medium wavelength one on another alternately until the total thickness becomes approximately 2 $\mu$m which contains $1\times10^{18}$ cm$^{-3}$ n-type impurity (silicon) is formed. Further on the multilayer reflection film 24, an bottom spacer layer 25 comprising an undoped $Al_{0.4}Ga_{0.6}As$, an undoped active layer 26 having a structure comprising three $Al_{0.2}Ga_{0.8}As$ quantum well layers and four GaAs barrier layers which are formed one on another alternately, and a top spacer layer 25a comprising an undoped $Al_{0.4}Ga_{0.6}As$ are formed, wherein the total film thickness of the top and bottom spacer layers 25 and 25a and the active layer 26 is an integral multiple of in-medium wavelength. Further on these layers, a multilayer reflection film 27 which is formed by laminating $Al_{0.9}Ga_{0.1}As$ layers and GaAs layers being ¼ of in-medium wavelength in thickness one on another alternately until the total thickness becomes approximately 2 $\mu$m which contains $1\times10^{18}$ cm$^{-3}$ p-type impurity (magnesium) is formed. On the p-type multilayer reflection film, a contact layer 28 comprising a p-GaAs layer having a thickness of 0.1 $\mu$m and containing $1\times10^{18}$ cm$^{-3}$ of p-type impurity is formed. In these processes, trimethylgallium, trimethylaluminum, or trimethylindium is used as a feed gas, and Bis-cyclopentadienyl magnesium ($Mg(C_5H_5)_2$) or silaneisusedas adopant, thesubstrate temperature when growing is 700 ° C., and growing is performed continuously with switching the feed gas successively without breaking a vacuum.

Subsequent processes are described with reference to FIGS. 5 and 6. Grooves 23a are formed in the row and column directions by photolithography as described hereunder.

Figure 5:
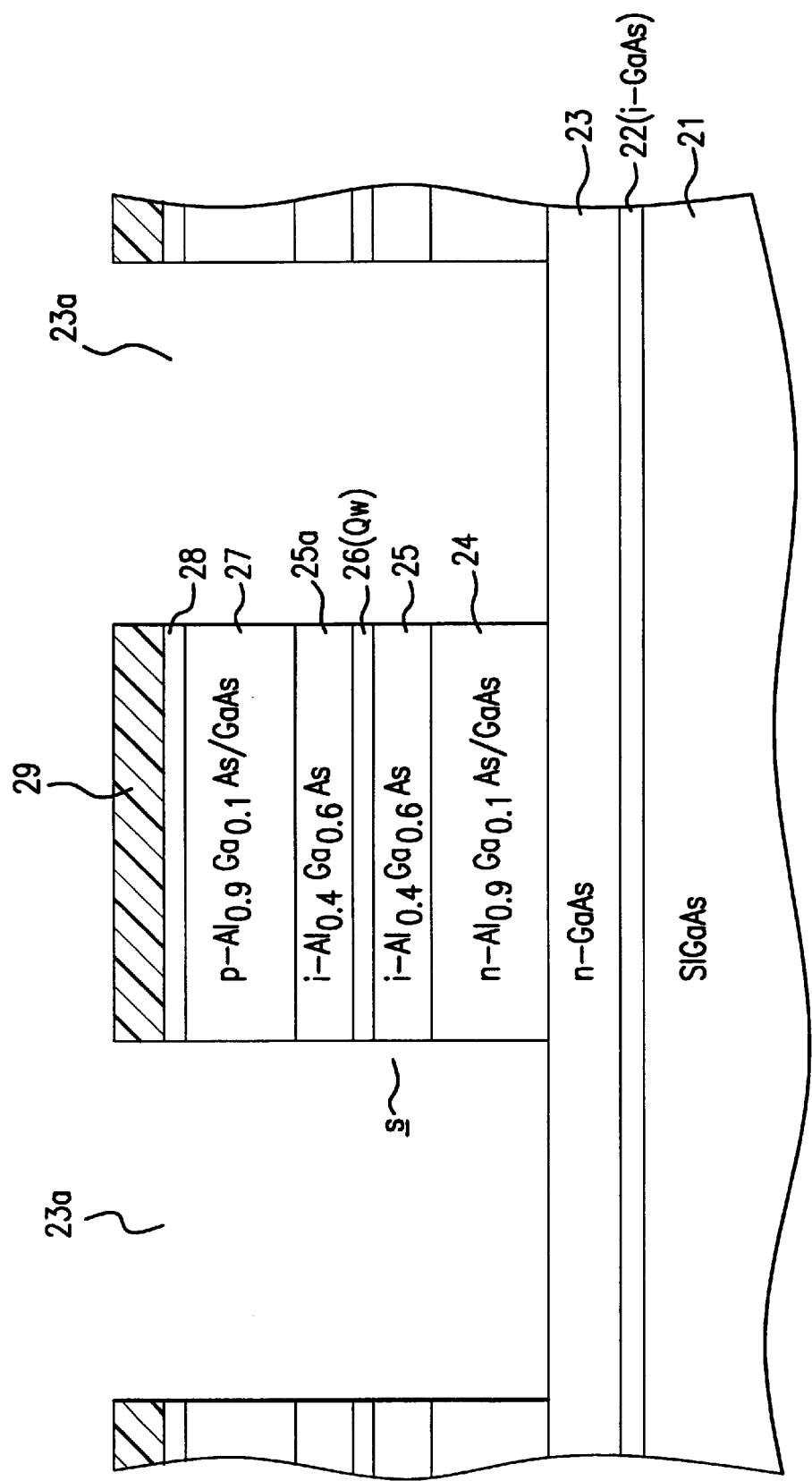
FIG. 5 is a side view of the surface emitting semiconductor laser array in accordance with the embodiment of the present invention in the manufacturing process.
Figure 6:
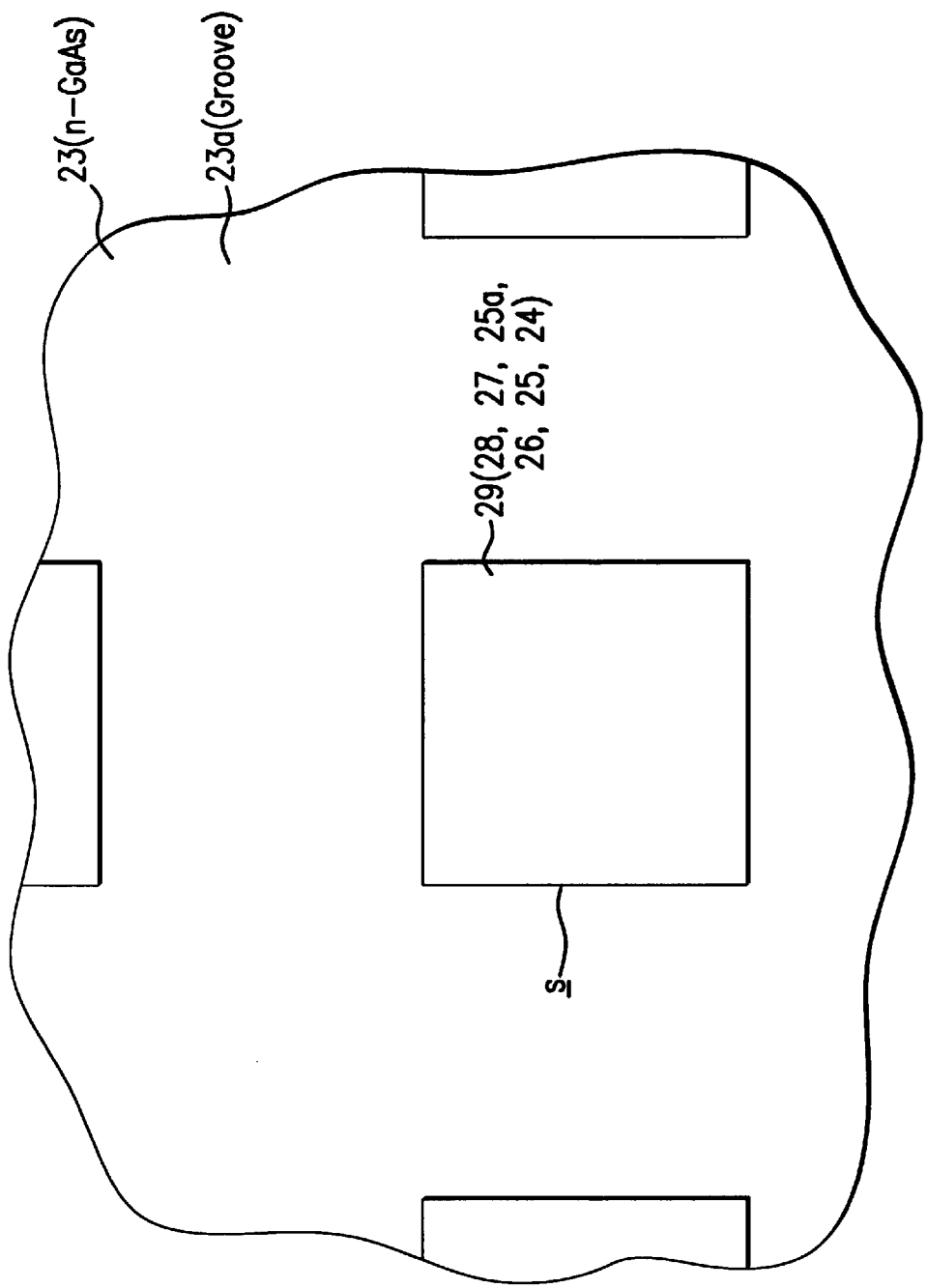
FIG. 6 is a plan view of the surface emitting semiconductor laser array in accordance with the embodiment of the present invention in the manufacturing process.

A photoresist mask 29 having a plurality of matrix-arranged-element-forming-areas which are defined by the row direction grooves (grooves arranged in the perpendicular direction to the paper plane in FIG. 5) and the column direction grooves (grooves arranged in the parallel direction to the paper plane in FIG. 5) is formed on the contact layer 28, grid-like grooves having a width of approximately 30 $\mu$m and a depth extending to the surface of the n-type GaAs contact layer 23 or intermediate depth of the n-type GaAs contact layer 23 are formed by reactive ion etching using carbon tetrachloride as etching gas, and semiconductor columns s having a square cross section with a side length of approximately 20 $\mu$m surrounded by the grid-like grooves are formed. FIG. 5 is a side view and FIG. 6 is a plan view.

Figure 7:
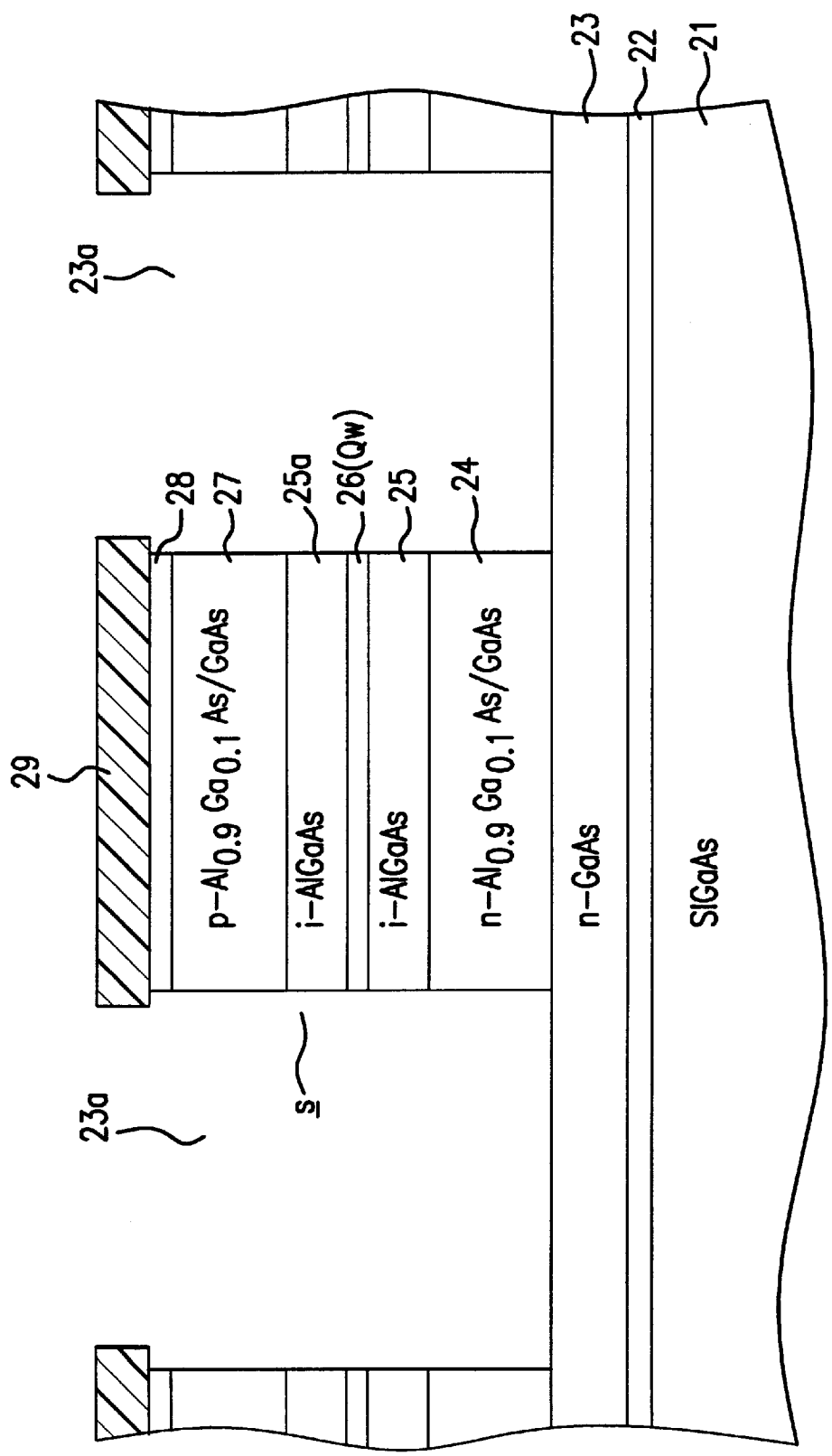
FIG. 7 is a side view of the surface emitting semiconductor laser array in accordance with the embodiment of the present invention in the manufacturing process.
Figure 8:
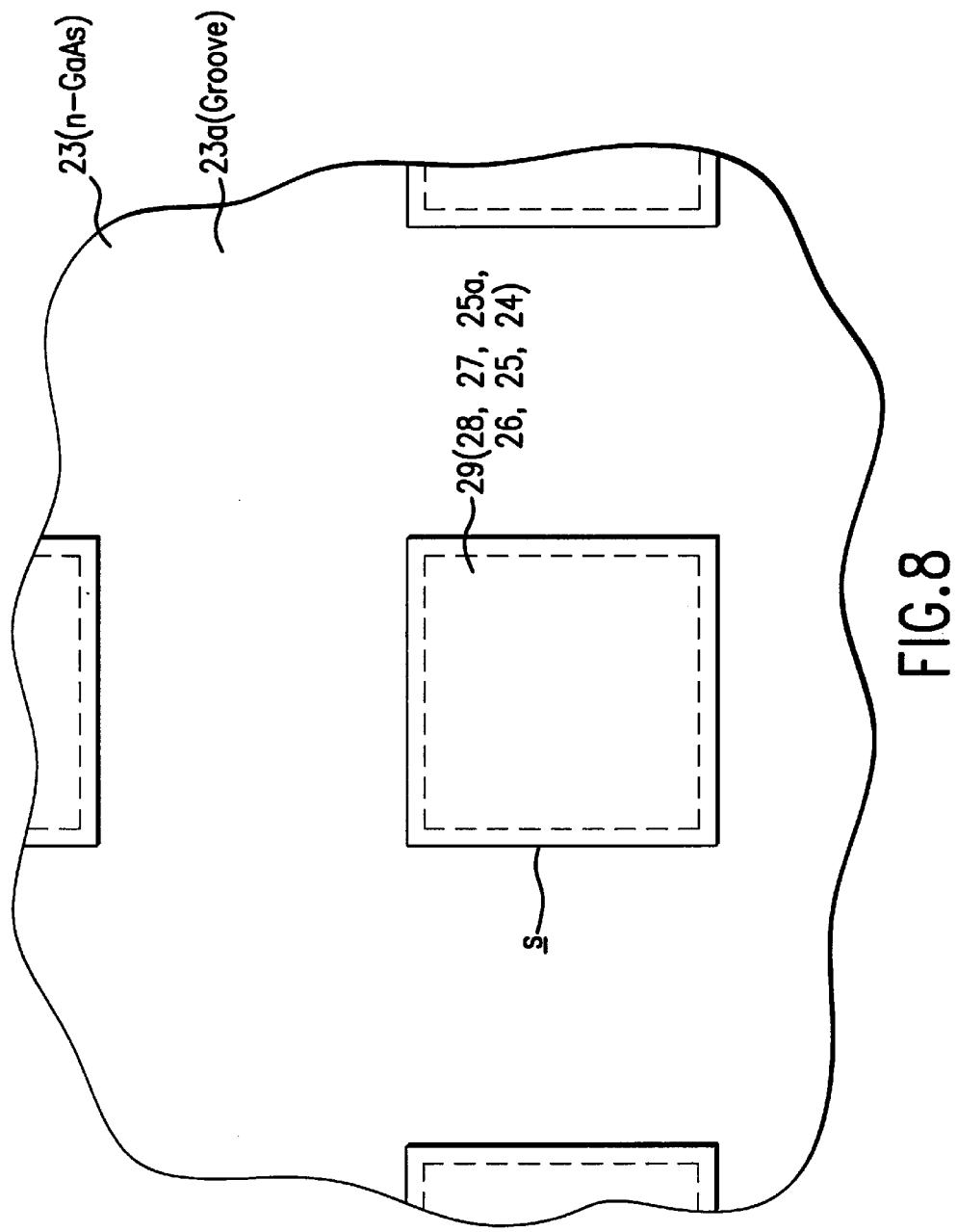
FIG. 8 is a plan view of the surface emitting semiconductor laser array in accordance with the embodiment of the present invention in the manufacturing process.

Further subsequent processes are described with reference to FIG. 7 and FIG. 8. The side surface of the semiconductor columns having a square cross section is side etched using an etchant consisting of a mixture of sulfuric acid, hydrogen peroxide, and water. The purpose of the side etching is to secure insulation between row direction electrodes 30 (electrodes comprising stripe like AuGe layers) to be formed in the next process and the semiconductor columns having a square cross section. FIG. 7 is a side view and FIG. 8 is a plan view.

Figure 9:
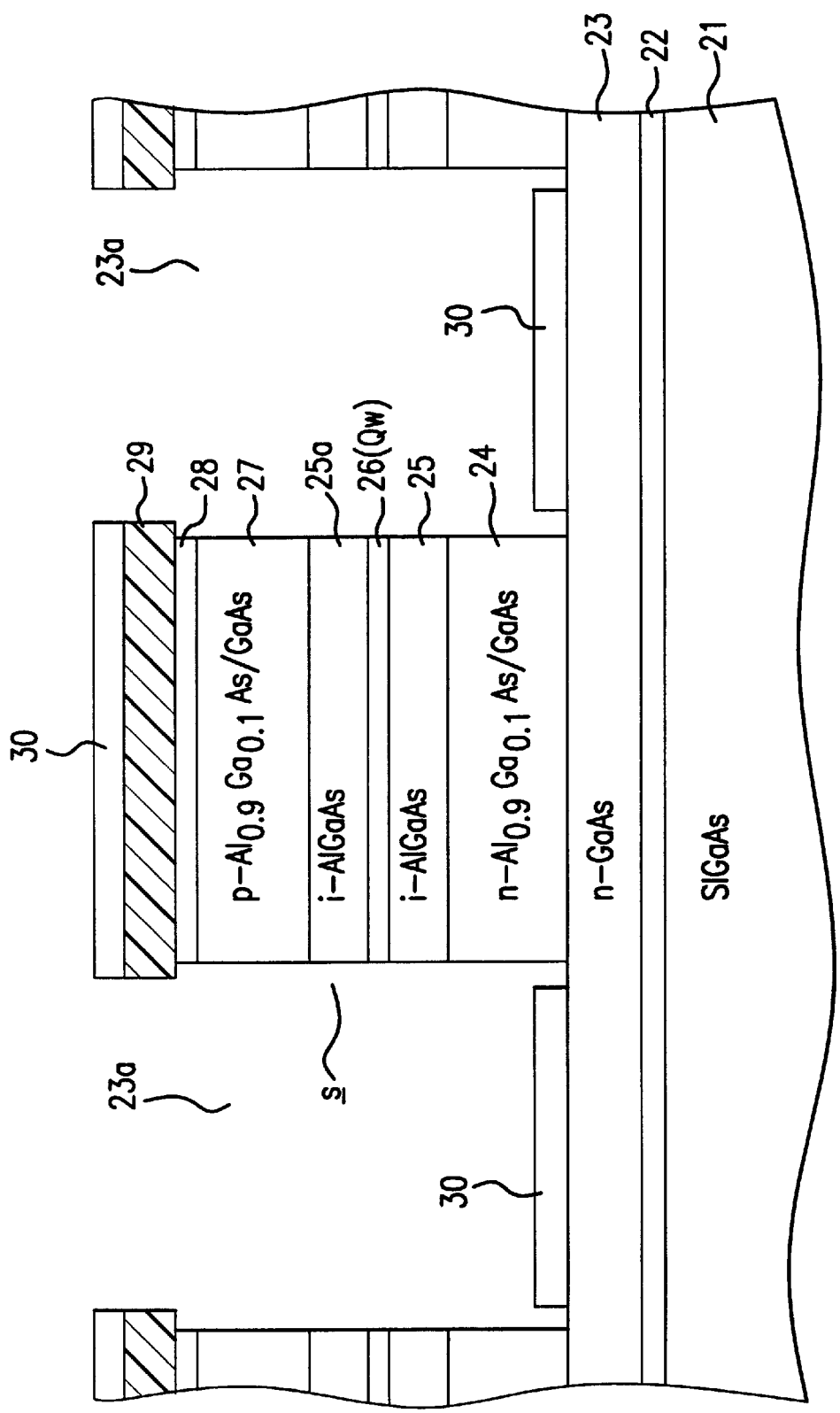
FIG. 9 is a side view of the surface emitting semiconductor laser array in accordance with the embodiment of the present invention in the manufacturing process.
Figure 10:
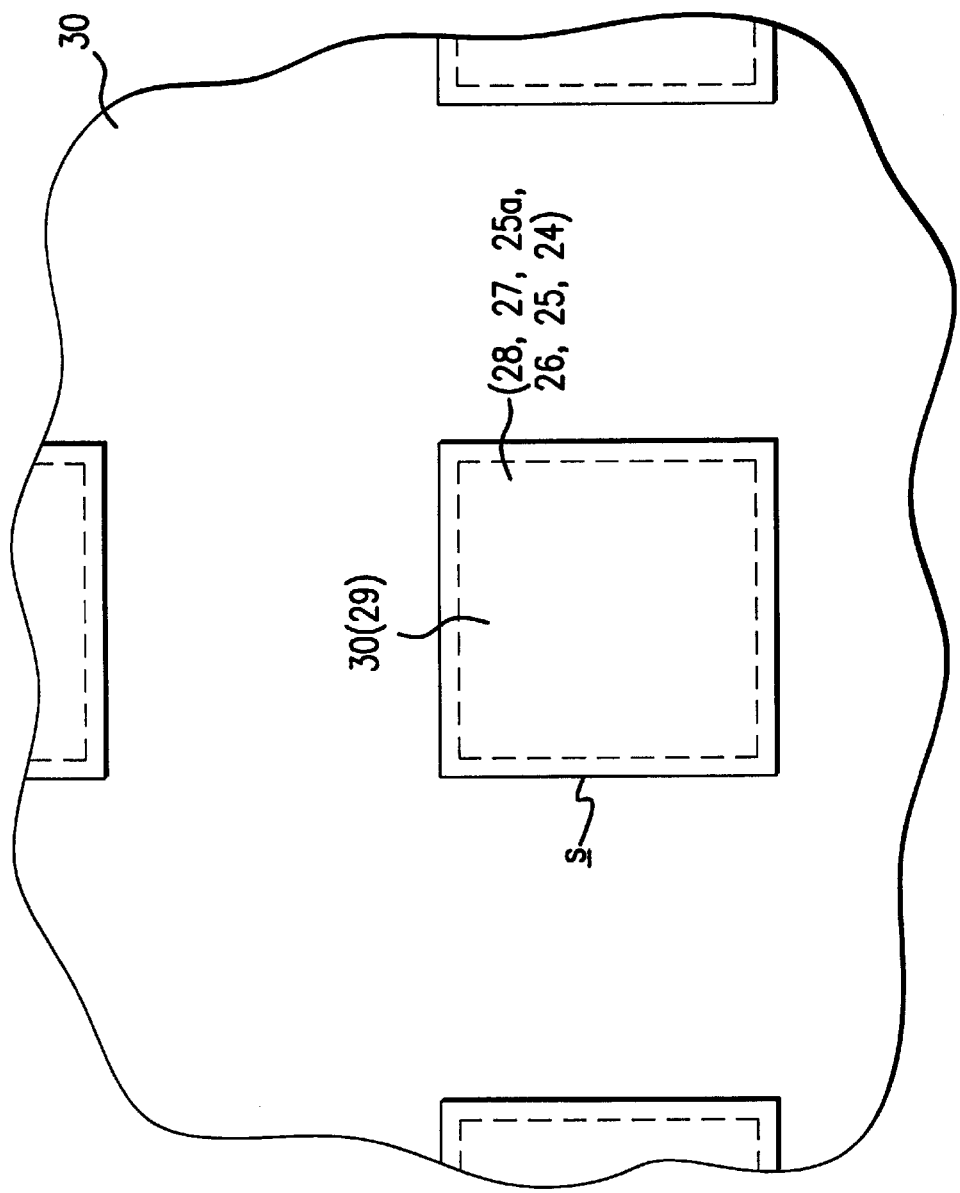
FIG. 10 is a plan view of the surface emitting semiconductor laser array in accordance with the embodiment of the present invention in the manufacturing process.

Further subsequent processes are described with reference to FIG. 9 and FIG. 10. AuGe is spattered using the resist mask 29 used in the previous process to form an AuGe layer 30 on the contact layer 23 in the grid-like grooves 23a and on the semiconductor columns having a square cross section. FIG. 9 is a side view and FIG. 10 is a plan view.

Figure 11:
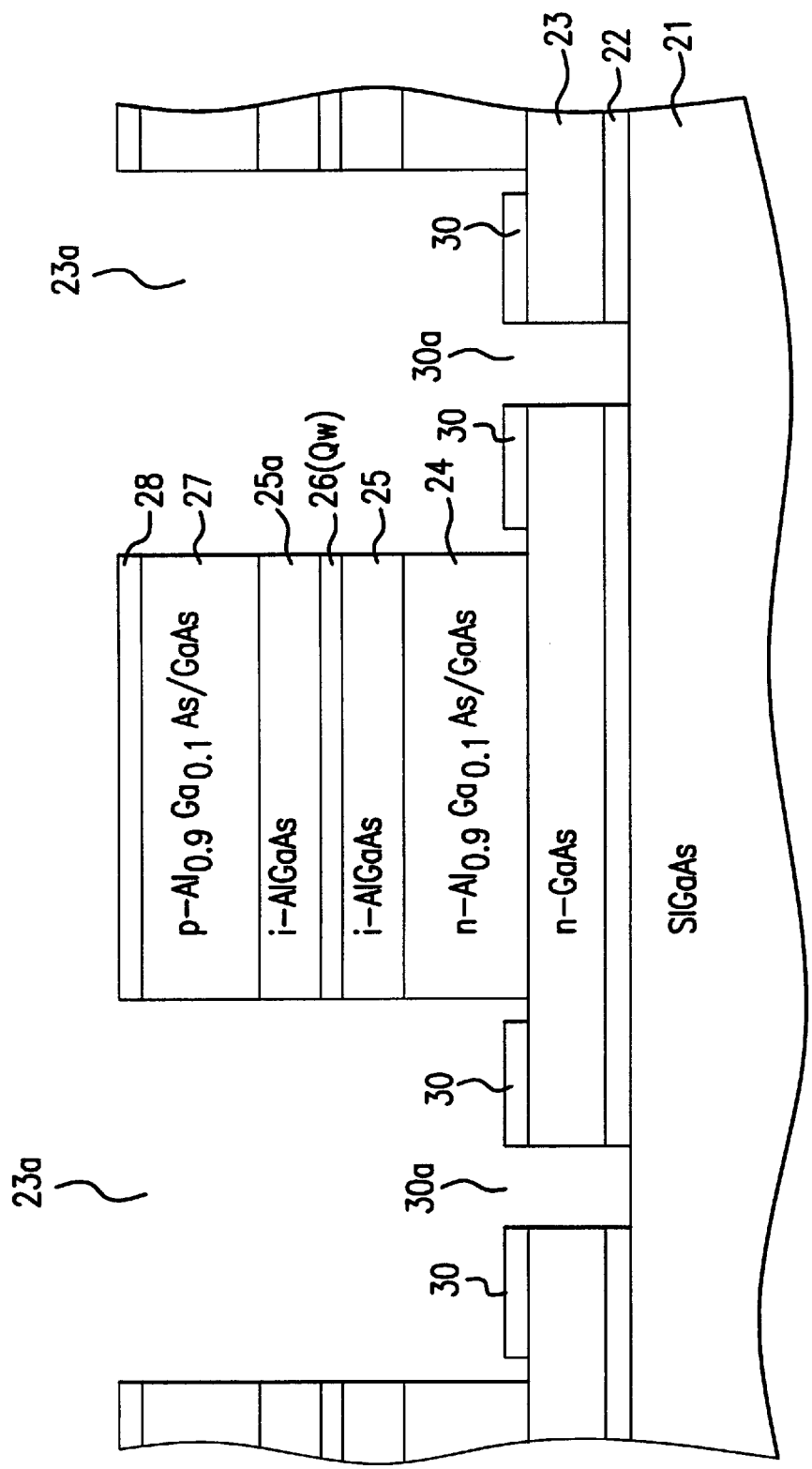
FIG. 11 is a side view of the surface emitting semiconductor laser array in accordance with the embodiment of the present invention in the manufacturing process.
Figure 12:
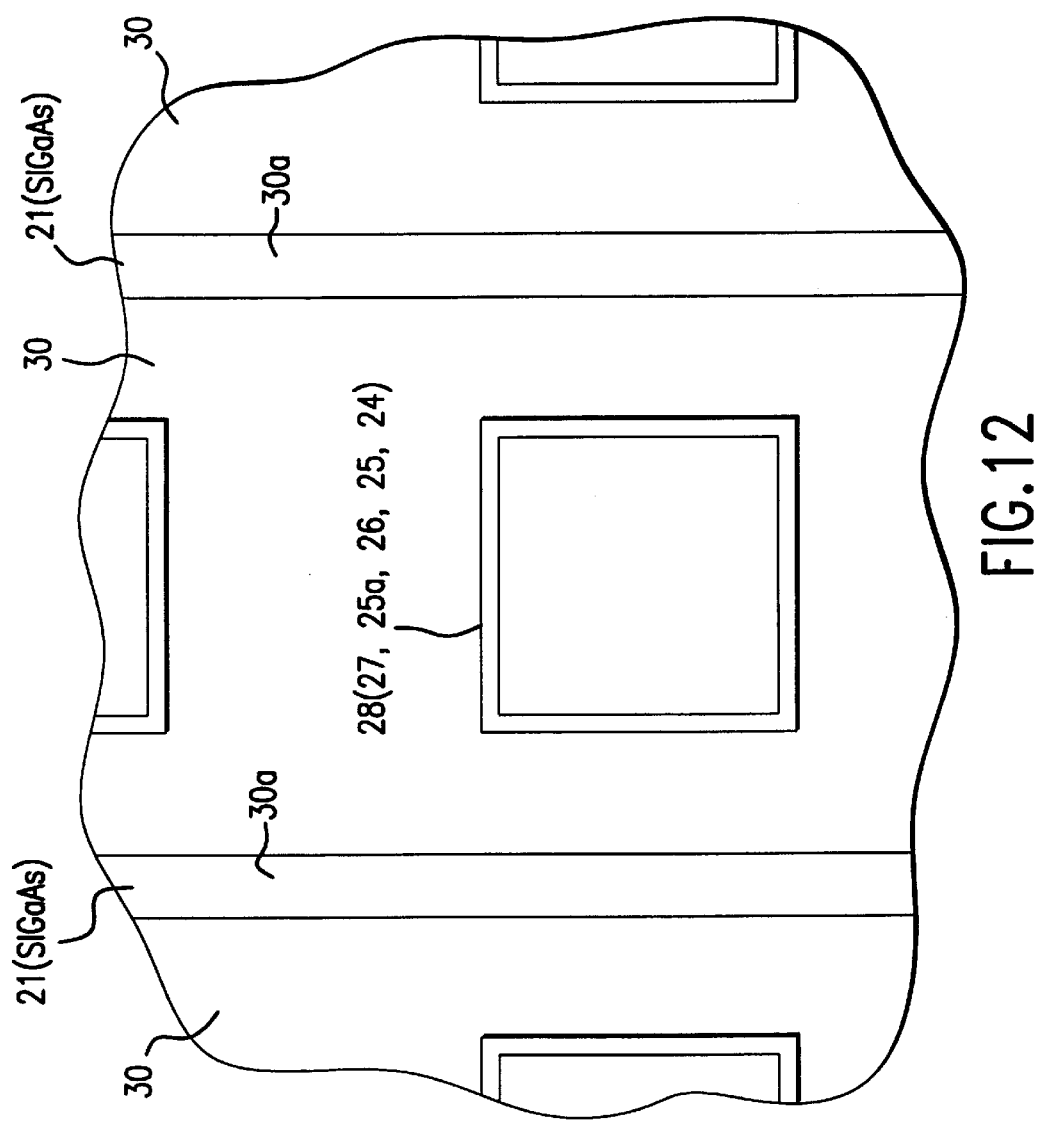
FIG. 12 is a plan view of the surface emitting semiconductor laser array in accordance with the embodiment of the present invention in the manufacturing process.

Further subsequent processes are described with reference to FIGS. 11 and 12. The AuGe layer 30 is removed from the top of the semiconductor columns having a square cross section by dissolving the used photoresist film 29, and then stripe grooves 30a having a width of 2 $\mu$m are formed to a depth extending to the bottom surface of the buffer layer 22 along the center line of the grid-like AuGe layer 30 in the row direction (direction perpendicular to the paper plane in FIG. 11) formed in the grid-like grooves 23a using focused ion beam etching.

As described hereinabove, the n-side electrodes are completed to be formed. Two n-side electrodes 30 are provided in a form of a pair on both sides of a surface emitting semiconductor laser. A stripe groove 30a is served to separate and allocate an n-side electrode 30 to the right and left surface emitting semiconductor lasers respectively. N-side electrodes 30 on both sides of a surface emitting semiconductor laser are connected to each other, the connection does not cause any trouble because these electrodes have the same potential.

Figure 1:
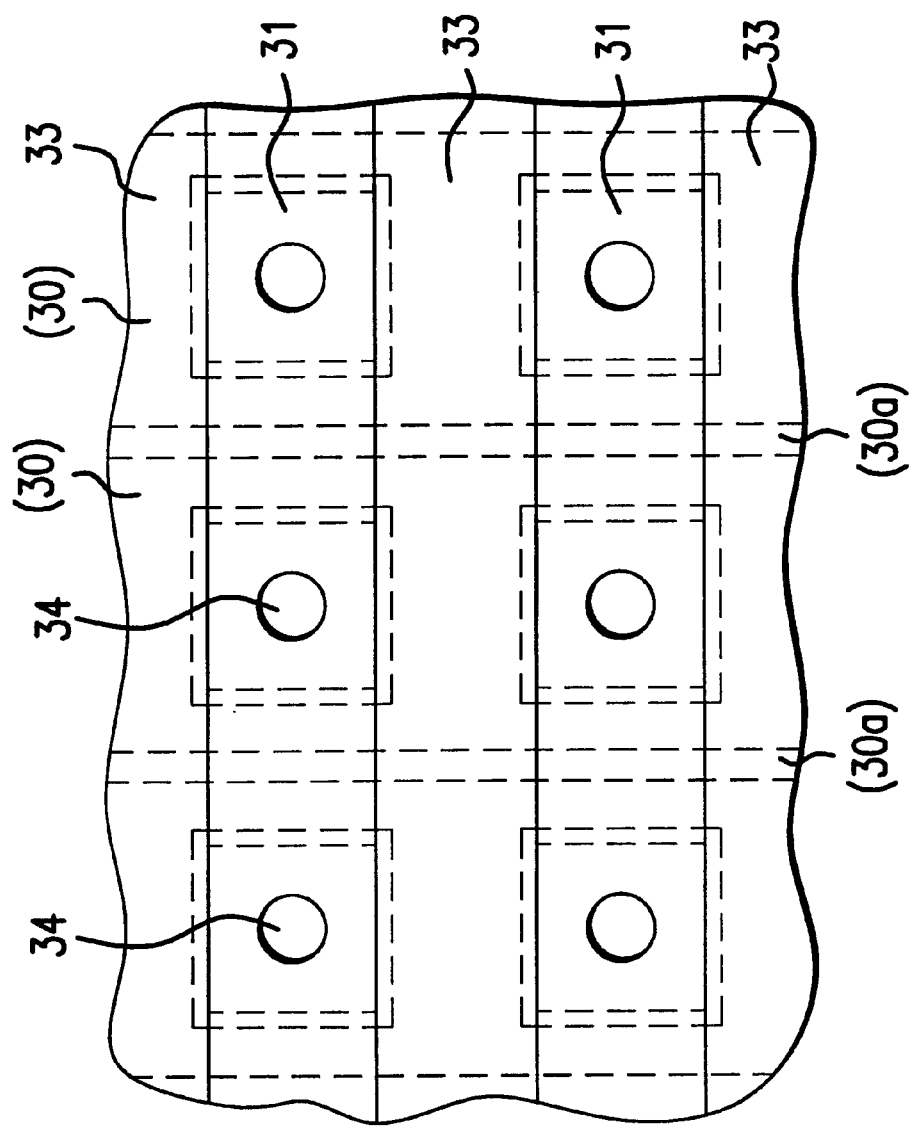
FIG. 1 is a plan view of a surface emitting semiconductor laser array in accordance with an embodiment of the present invention.

Subsequent processes are described with reference to FIGS. 1 to 3. Polyimide films 33 are formed by filling the grid-like grooves 23a with polyimide. FIG. 1 is a plan view, FIG. 2 is a side view viewing upward the plan view of FIG. 1 from the back side of the paper plane, and FIG. 3 is a side view viewing the plan view of FIG. 1 from right-lift direction on the paper plane.

Figure 2:
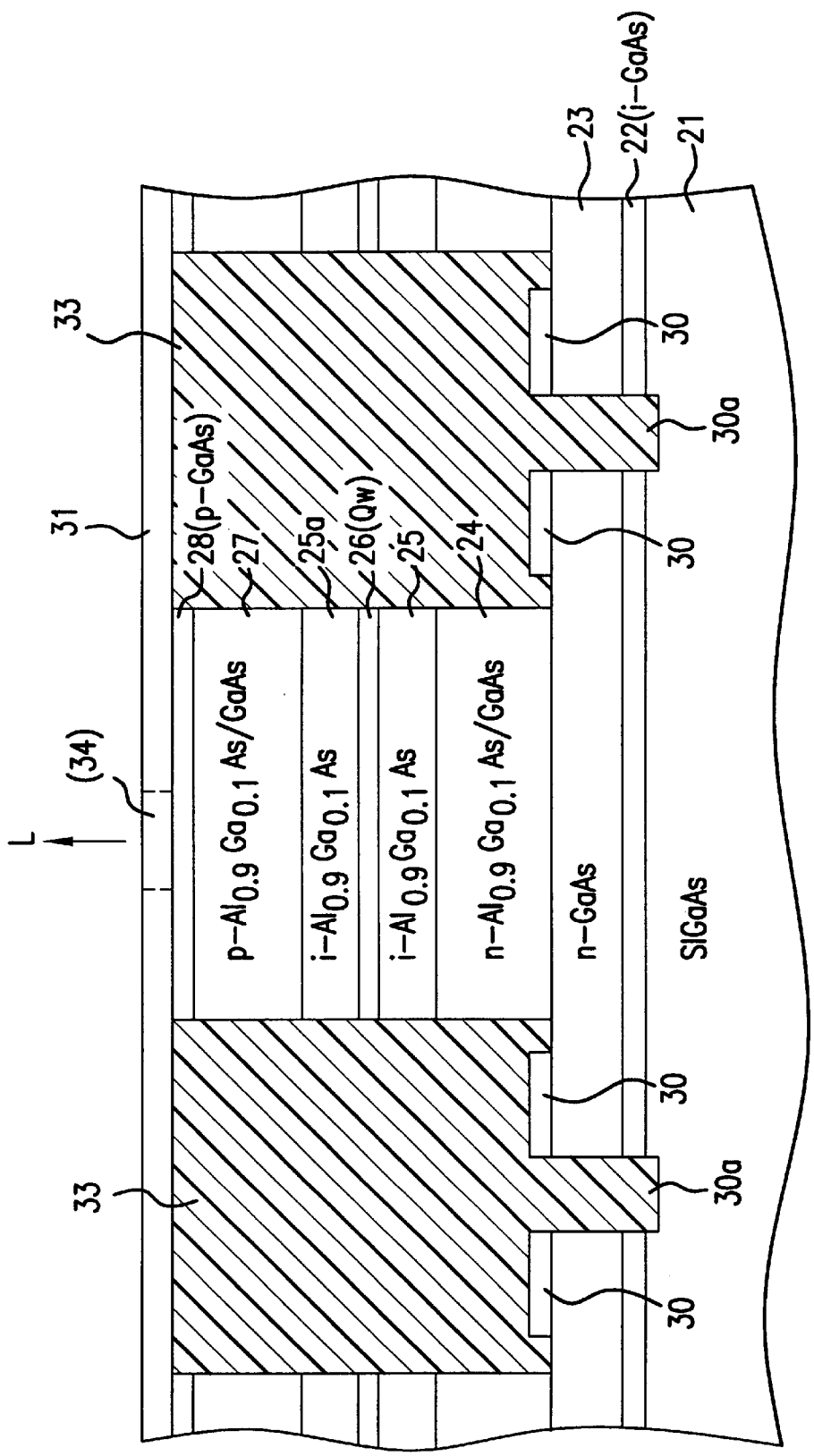
FIG. 2 is a side view (viewing FIG. 1 from the bottom side) of the surface emitting semiconductor laser array in accordance with the embodiment of the present invention.
Figure 3:
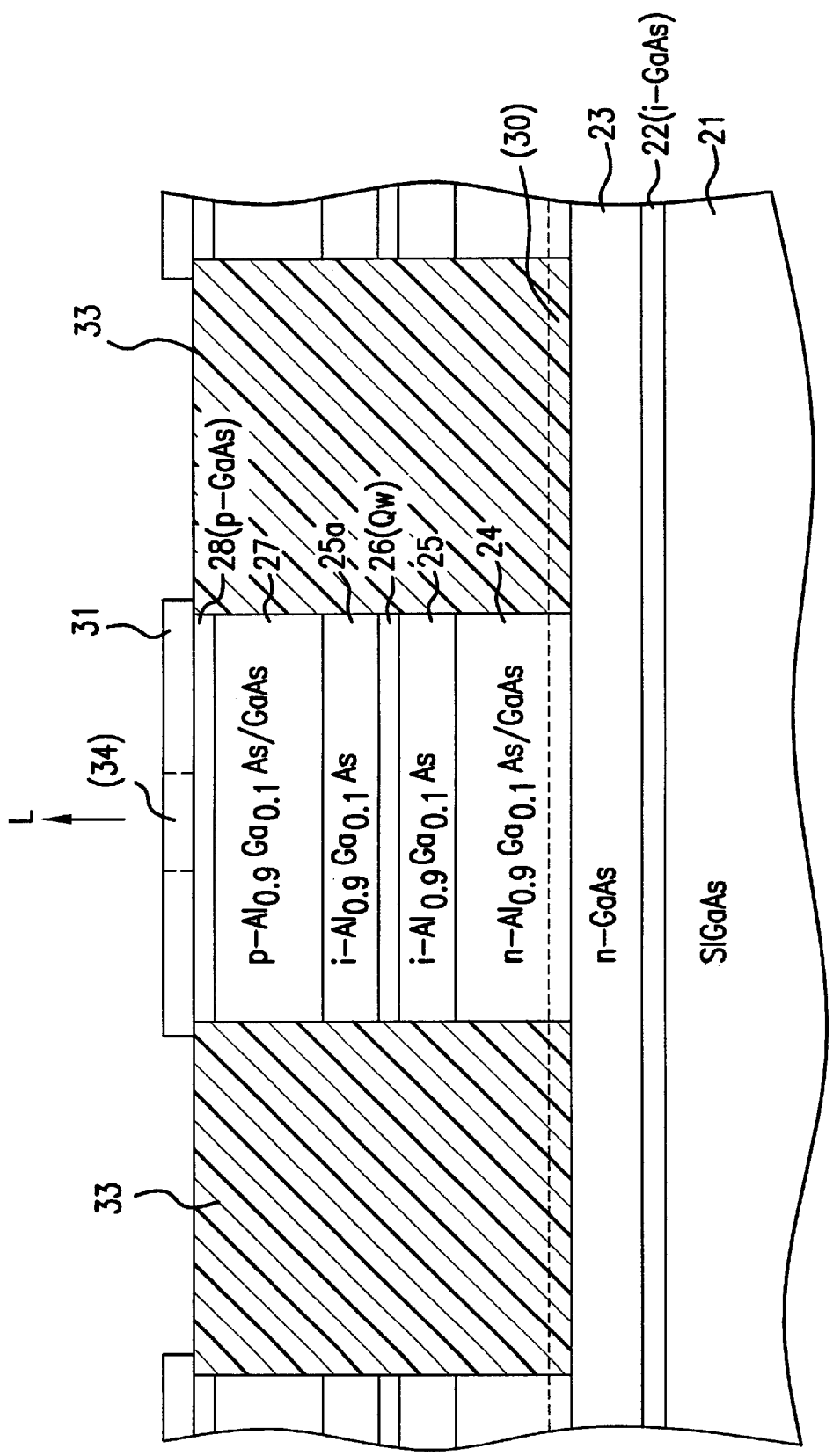
FIG. 3 is a side view (viewing FIG. 1 in the right-left direction) of the surface emitting semiconductor laser array in accordance with the embodiment of the present invention.

The surface of the polyimide film is polished so as to be equal to the surface of the contact layer 28, an Au film is formed, the Au film is separated in the form of stripe corresponding to each column as shown in FIGS. 1 and 3 (in the direction orthogonal to the n-side electrode 30 consisting of an AuGe layer, namely in the direction parallel to the paper plane in FIGS. 1 and 2), and an aperture 34 corresponding to a light outgoing opening is formed and a p-side electrode 31 is formed.

Because the matrix driving type surface emitting semiconductor laser array manufactured through the processes as described hereinabove has top and bottom electrodes both consisting of metal, this surface emitting semiconductor laser array is advantageous in that the resistance of current passage is low, the power consumption is low, the operational speed is fast, and the resistance of each element is uniform and has reduced dispersion. The manufacturing method is by no means limited to this method, alternatively, a method in which a resist film having apertures is formed so as not to contact semiconductor columns s without etching on the side surface of the semiconductor columns when the bottom electrode is formed, may be used as the mask.

Figure 13:
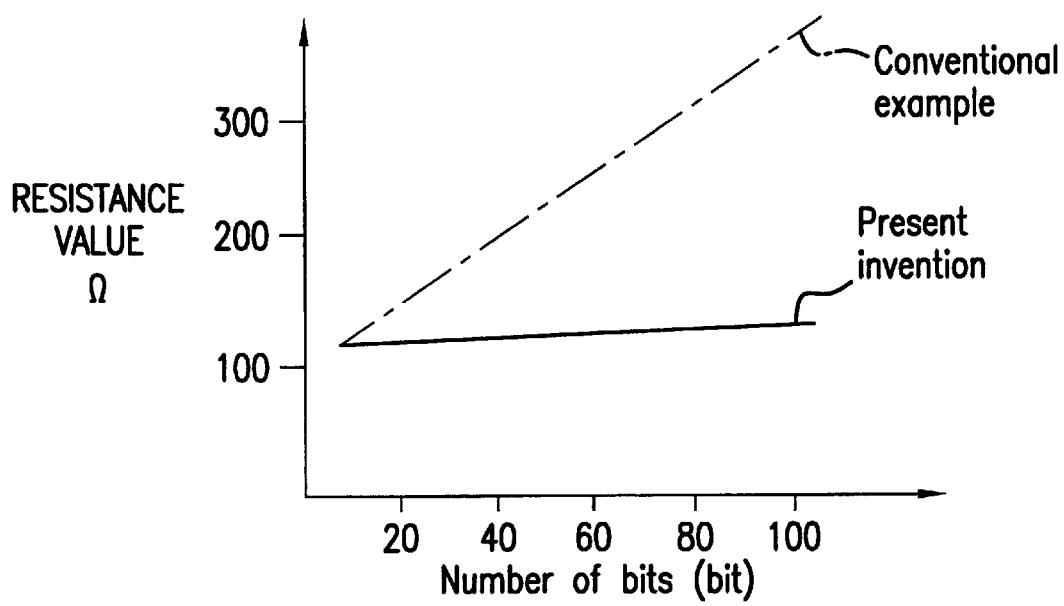
FIG. 13 is a graph for describing an effect confirmation test of the surface emitting semiconductor laser array in accordance with the present invention.

The characteristics of the surface emitting semiconductor laser array in accordance with the present invention is shown in FIG. 13 for presenting the result of an effect confirmation test. The test result on a surface emitting semiconductor laser array of the prior art having the structure shown in FIGS. 15 and 16 obtained by carrying out an effect confirmation test under the same conditions as those applied to the surface emitting semiconductor laser array in accordance with the present invention is also shown together. In FIG. 13, the resistance of the conventional example is shown in comparison with the resistance of the present invention. The resistance for driving one bit is shown under the condition that the resistance of the laser element is 100 Ω and elements are arranged with an interval of 50 μm, the resistance increases with the number of elements namely with the array scale in the case of the conventional example. On the other hand, the resistance of the area other than element area does not increase in spite of increment in the number of bits (product of the number of rows and the number of columns), and the power consumption is obviously low.

Figure 14:
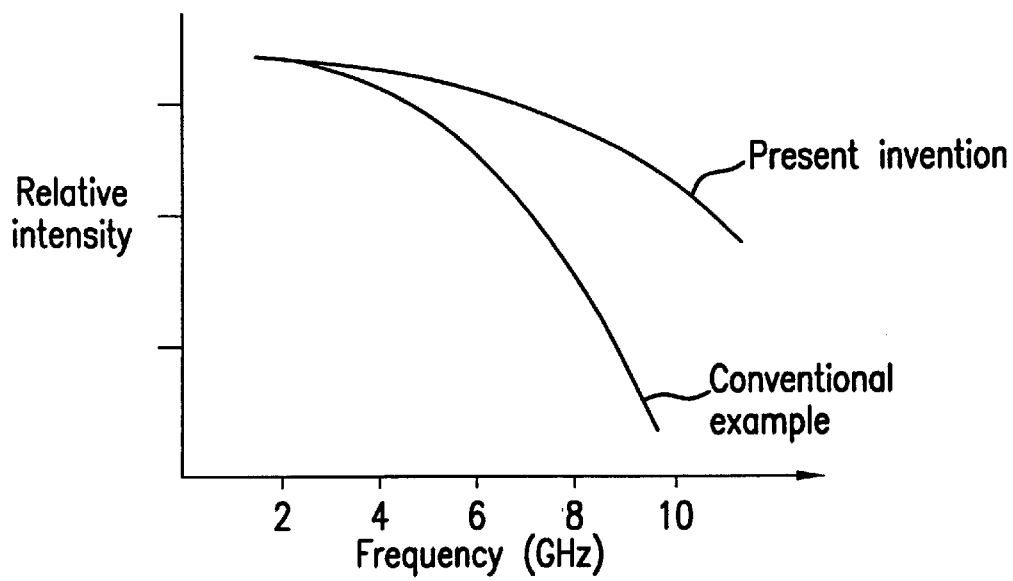
FIG. 14 is a graph for describing the effect confirmation test of the surface emitting semiconductor laser array in accordance with the present invention.
Figure 15:
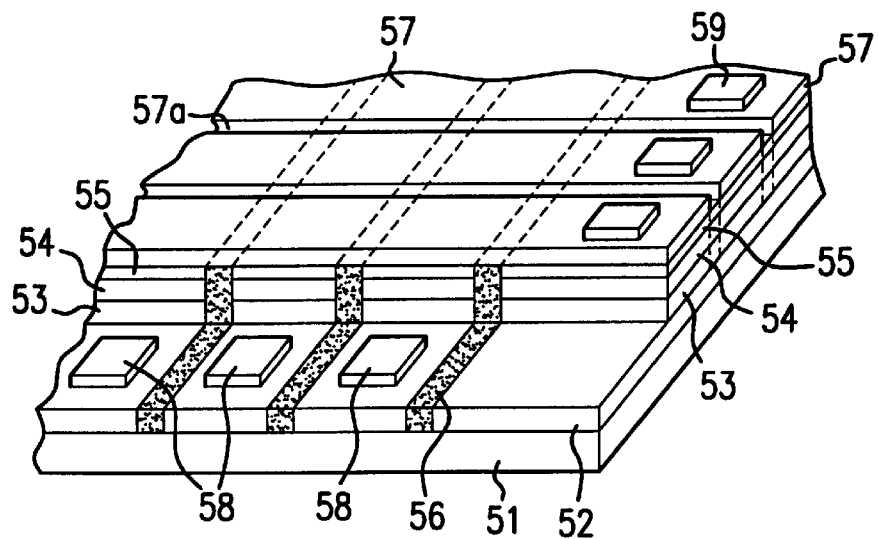
FIG. 15 is a perspective view of a surface emitting semiconductor laser array in accordance with the prior art.
Figure 16:
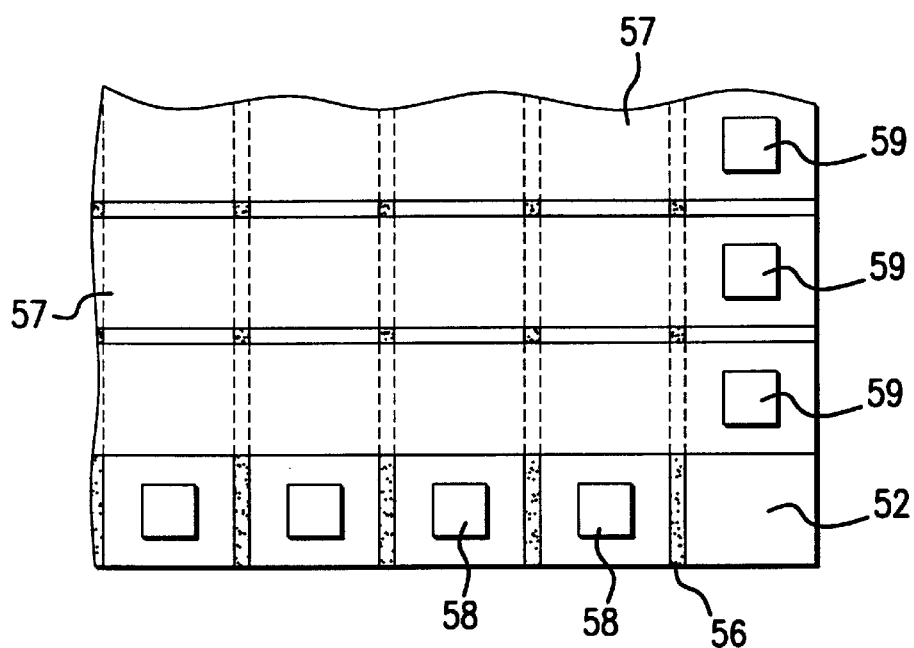
FIG. 16 is a perspective view of the surface emitting semiconductor laser array in accordance with the prior art.
Figure 17:
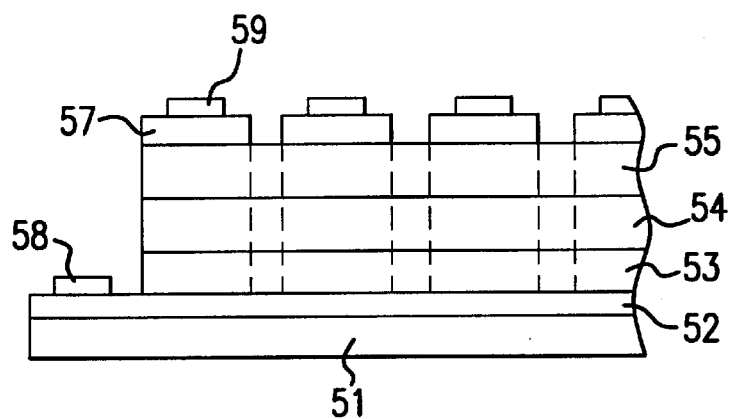
FIG. 17 is a perspective view of the surface emitting semiconductor laser array in accordance with the prior art.
Figure 18:
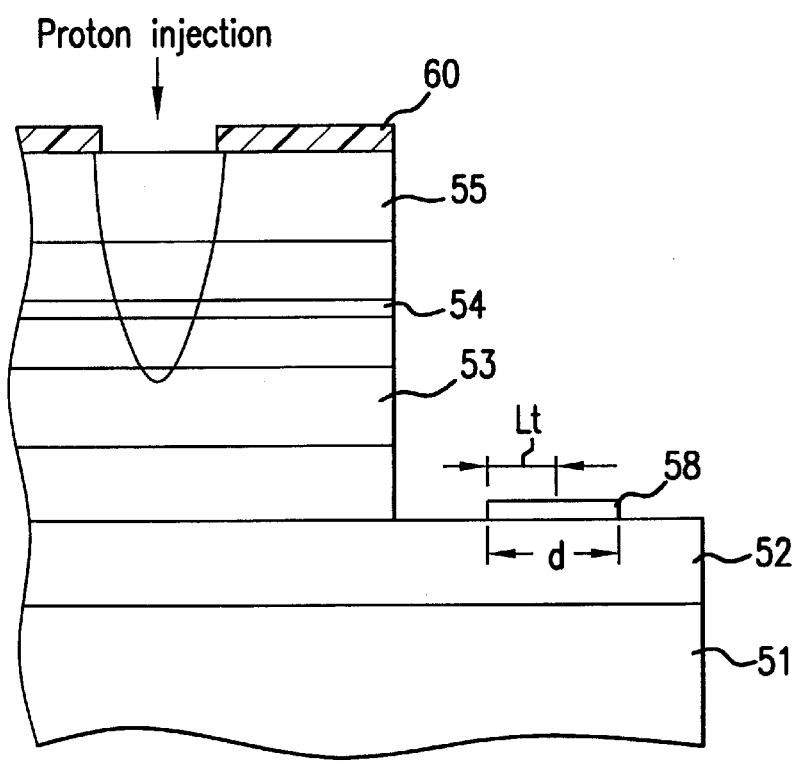
FIG. 18 is a diagram for analyzing disadvantages of the surface emitting semiconductor laser array in accordance with the conventional art.

In FIG. 14, the frequency characteristic of the matrix driving type surface emitting laser array in accordance with the present invention in high speed operation is shown together with that of the surface emitting semiconductor laser array of the prior art having the structure shown in FIGS. 15 and 16. The operation speed of the matrix driving type surface emitting semiconductor array of the present invention is obviously faster because of smaller resistance.

In the above-mentioned embodiment, one example of a laser body having the active layer comprising InGaAs layers and GaAs layers and the spacer layer comprising an AlGaAs layer is shown, however, combination of an active layer comprising GaAs layers or AlGaAs layers and AlGaAs layers and a spacer layer comprising an AlGaAs layer, and combination of an active layer comprising InGaP layers or InGaAlP layers and InGaAlP layers and an active layer comprising an InGaAlP layer have been known.

In the above-mentioned embodiment, the resistance of the bottom contact layer which functions also as a current guide passage is desirably low, therefore the impurity concentration is desirably $10^{17}$ cm$^{-3}$ or higher.

What is claimed is:

1. A surface semiconductor laser, comprising:
   a surface emitting semiconductor laser body, including:
   an active layer;
   top and bottom spacer layers sandwiching said active layer; and
   top and bottom multilayer reflection films sandwiching said top and bottom spacer layers;
   a conductive bottom contact layer having a flat area larger than the flat area of said body, wherein said body is fromed on said bottom contact layer;
   an insulating substrate on which a plurality of units are arranged in the form of a matrix, each unit of said plurality of units including said body and said bottom contact layer;
   a bottom metal electrode extending continuously in one direction of said matrix beside each said body on the top surface of the bottom contact layer of each of said plurality of units arranged in parallel in the one direction of said matrix; and
   top metal electrodes extending in another direction of said matrix on each of said plurality of units arranged in parallel in the other direction of said matrix.

2. The surface emitting semiconductor laser, recited in claim 1, further including an insulating layer filled above said bottom metal electrode, wherein said top electrodes are formed on said insulating layer.

3. The surface emitting semiconductor laser as claimed in claim 2, wherein said insulating layer is filled up almost as high as the top surface of said body.

4. The surface emitting semiconductor laser as claimed in claim 1, wherein the bottom contact layer consists of a semiconductor having an impurity concentration of $10^{17}$ cm$^{-3}$ or higher.

5. A surface semiconductor laser, comprising:
   a surface emitting semiconductor laser body, including:
   an active layer;
   top and bottom spacer layers sandwiching said active layer; and
   top and bottom multilayer reflection films sandwiching said top and bottom spacer layers;
   an insulating substrate on which a plurality of said bodies are arranged in the form of a matrix, some of said bodies being arranged in one direction of the matrix and others of said bodies being arranged in another direction of the matrix;
   bottom metal electrodes electrically connected to a bottom side, each of said bottom metal electrodes extending continuously in the one direction of said matrix beside said bottom multilayer reflection films;
   an insulating layer filled above said bottom metal electrodes almost as high as a top surface of said body; and
   top metal electrodes electrically connected to the top surface of said bodies and extending in the other direction of said matrix on said insulating layer.

* * * * *